United States Patent [19]

Kimura et al.

[11] Patent Number: 4,680,553

[45] Date of Patent: Jul. 14, 1987

[54] INTERMEDIATE FREQUENCY AMPLIFIER WITH SIGNAL STRENGTH DETECTION CIRCUIT

[75] Inventors: Katsuji Kimura; Yoshihiko Kasai, Asazawa; Hiroshi; Yukio Yokoyama, Sasaki; Yutaka; Koji Yamasaki; Toshifumi Sato, all of Tokyo, Japan

[73] Assignee: NEC corporation, Tokyo, Japan

[21] Appl. No.: 800,831

[22] Filed: Nov. 22, 1985

[30] Foreign Application Priority Data

| Jan. 18, 1985 | [JP] | Japan | 60-6844 |
| Mar. 18, 1985 | [JP] | Japan | 60-55168 |
| Apr. 9, 1985 | [JP] | Japan | 60-75133 |
| Jul. 11, 1985 | [JP] | Japan | 60-153010 |
| Jul. 18, 1985 | [JP] | Japan | 60-159364 |
| Nov. 1, 1985 | [JP] | Japan | 60-245861 |
| Nov. 1, 1985 | [JP] | Japan | 60-245862 |

[51] Int. Cl.$^4$ .......................................... H03F 3/45
[52] U.S. Cl. ........................................ 330/2; 328/26; 330/252; 455/155
[58] Field of Search ............... 330/2, 252; 328/26; 455/154, 155, 211, 226; 329/101, 164, 166

[56] References Cited

U.S. PATENT DOCUMENTS

| 3,241,078 | 3/1966 | Jones | 329/166 X |
| 3,697,685 | 10/1972 | Lunn | 329/101 X |
| 4,555,671 | 11/1985 | Numata | 330/2 |

OTHER PUBLICATIONS

Baskerville, "A Single-Chip Television IF System", *IEEE J. of Solid-State Circuits*, vol. SC-7, No. 6, Dec. 1972, pp. 455–461.

*Primary Examiner*—James B. Mullins
*Attorney, Agent, or Firm*—Sughrue, Mion, Zinn, Macpeak and Seas

[57] ABSTRACT

An intermediate frequency amplifier stage is disclosed, in which linearity of a signal strength detection output is improved. The intermediate frequency amplifier stage includes a plurality of intermediate frequency amplifiers, a plurality of double-wave rectifiers each coupled to the associated intermediate frequency amplifier and making full-wave rectification of the signal supplied from the associated intermediate frequency amplifier, and an adder circuit adding the rectification outputs of the respective double-wave rectifiers.

11 Claims, 17 Drawing Figures

INTERMEDIATE FREQUENCY AMPLIFIER WITH SIGNAL STRENGTH DETECTION CIRCUIT

BACKGROUND OF THE INVENTION

The present invention relates to a receiver in an automobile subscriber station, a cordless telephone, or an FM tuner, and more particularly to an intermediate frequency amplifier stage used in such a receiver and equipped with a signal strength detection circuit.

An intermediate frequency amplifier stage typically comprises of a plurality of amplifiers in order to amplify the received very weak signal, and is further equipped with a circuit for detecting the strength of the received signal. The output of the signal strength detection circuit is used to judge the reception conditions or to drive a signal level meter. The signal strength detection circuit includes a plurality of rectifiers, each coupled to an associated amplifier in the intermediate frequency amplifier stage. The outputs of the respective rectifiers are added to derive the output of the signal strength detection circuit.

Each signal rectifier according to prior art has been a half wave rectifier circuit utilizing a capacitor and a base-emitter junction diode of a transistor, as disclosed in "Microelectronics and Reliability" Vol. 16, pp. 345 to 366, Pergamon Press, 1977. However, such half wave rectifier circuits are inferior in their rectification efficiency. For this reason, the added outputs of the rectifiers, that is, the signal strength detection output, has considerably poor linearity. If the number of the rectifiers is increased the linearity improves, but this involves an attendant increase in the number of intermediate frequency amplifiers. Moreover, each capacitor occupies a relatively large chip area and thus is not suitable for being formed as an integrated circuit. When the intermediate frequency becomes low, the capacitors are required to have a considerable capacitance, so that it becomes impossible to fabricate the capacitors in an integrated circuit.

SUMMARY OF THE INVENTION

Therefore, an object of the present invention is to provide an intermediate frequency amplifier stage in which the linearity of a signal strength detection output is improved without increasing the number of intermediate frequency amplifiers.

Another object of the present invention is to provide an intermediate frequency amplifier stage equipped with a signal strength detection circuit using no capacitors.

Still another object of the present invention is to provide an intermediate frequency amplifier stage suitable for a monolithic integrated circuit.

An intermediate frequency amplifier stage according to the present invention comprises a plurality of intermediate frequency amplifiers, a plurality of double-wave rectification circuits coupled to the associated intermediate frequency amplifiers and performing full-wave rectification of supplied signals and an adder circuit adding the outputs of the respective double-wave rectification circuits.

The double-wave rectification circuit presents rectification efficiency superior to a half wave rectification circuit. Accordingly, the output of the adder circuit which represents the level or strength of an intermediate frequency signal shows good linearity without increasing the number of the intermediate frequency amplifiers.

It is favorable to constitute each double-wave rectification circuit with a so-called double balanced differential amplifier. The double balanced differential amplifier has three differential circuits. The first differential circuit is supplied at its input with the signal from the intermediate frequency amplifier, and its true and complementary outputs are used as current sources for the second and third differential circuits, respectively. The second and third differential circuits are also supplied with the signal from the intermediate frequency amplifier, and their outputs are connected in common. As a result, the double balanced differential amplifier makes full-wave rectification of the signal from the intermediate frequency amplifier without using a capacitor and generates the rectification output. Further, one or more additional differential circuits having a different gain may be provided, whose inputs and outputs are connected in common to the first differential amplifier. With such a structure the number of the double-wave rectification circuits coupled to one intermediate frequency amplifier is increased equivalently, and therefore the linearity of the output of the adder circuit is further improved.

BRIEF DESCRIPTION OF THE DRAWINGS

The above and other objects, advantages and features of the present invention will be more apparent from the following description taken in conjunction with the accompanying drawings.

DETAILED DESCRIPTION OF THE PRIOR ART

Figure 1:
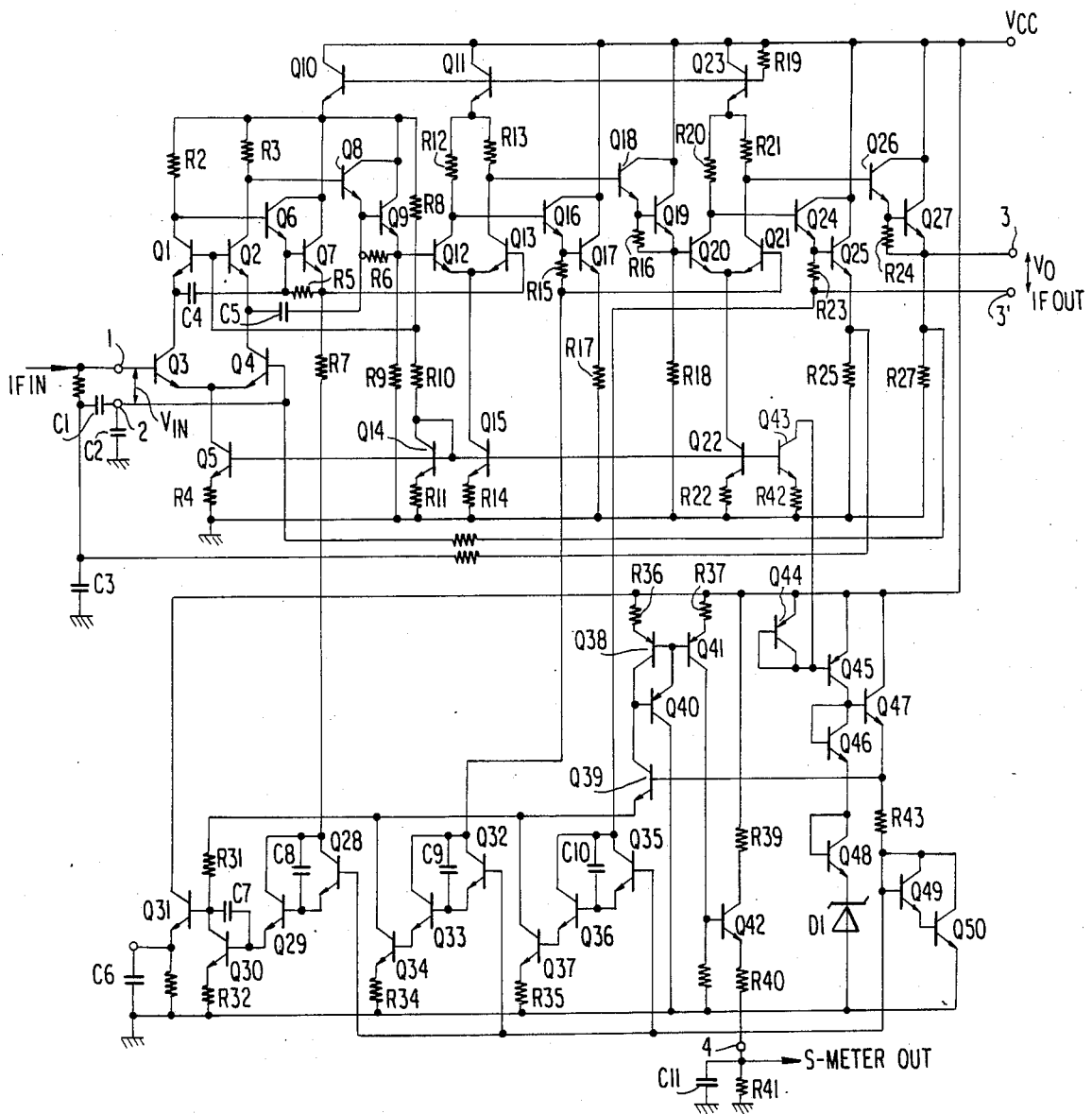
FIG. 1 is a circuit diagram of an intermediate frequency amplifier stage equipped with a signal strength detection circuit according to prior art.

In FIG. 1, an intermediate frequency amplifier stage disclosed in the above-mentioned article is shown. This circuit is constituted of three differential amplifier stages, and an FM intermediate frequency signal is supplied to an input terminal 1. The first stage differential amplifier is composed of transistors Q1 to Q10, resistors R2 to R9 and capacitors, C4, C5, and the second stage differential amplifier is composed of transistors Q12 to Q19 and resistors R10 to R18. The third stage differential amplifier is composed of transistors Q20 to Q27 and resistors R19 to R27, and the amplified intermediated frequency signal is derived from output terminals 3, 3'. The respective amplifier stages are also coupled to rectification circuits. The first stage rectification circuit is composed of transistors Q28 to Q30, resistors R31 to R33 and capacitors C6 to C8, and the second stage rectification circuit is composed of transistors Q32 to Q34, resistors R34 and a capacitor C9. The third stage rectification circuit is composed of transistors Q35 to Q37, resistors R35 and a capacitor C10. Each rectification circuit is a half wave rectifier utilizing the capacitor C8 (C9, C10) and the base-emitter junction of the transistor Q28 (Q33, Q36). The outputs of the respective rectification circuits are supplied to an adding circuit composed of transistors Q38 to Q41 and resistors R36, R37 to be added, and the adder output is supplied to a terminal 4 through an emitter follower circuit of a transistor Q42 and resistors R38 to R40. The terminal 4 is connected with a resistor R41 and a capacitor C11 to remove a carrier wave component, and hence a signal strength detection output is derived from the terminal 4. Transistors Q43 to Q50, resistors R42, R43 and a diode D1 constitute a biasing circuit. A terminal 2 is a feedback terminal grounded through a capacitor C2 and further is connected to the input terminal 1 through a capacitor C1 and a resistor R1. The connection point of the resistor R1 and the capacitor C1 is grounded through a capacitor C3.

Figure 2:
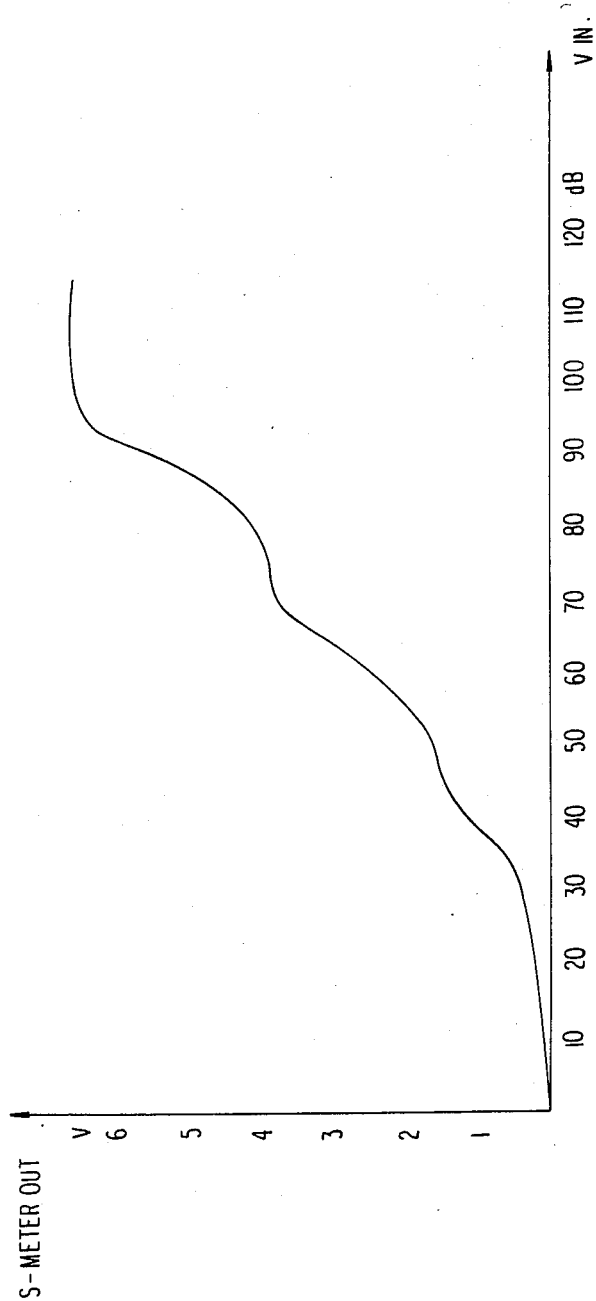
FIG. 2 is a graph representing a characteristic of an input signal level versus a signal strength detection output voltage in the circuit shown in FIG. 1.

Thus, each rectification circuit according to prior art is a half wave rectifier, and therefore its rectification efficiency is disadvantageous. As a result, with respect to a change in the level of the input signal $V_{IN}$, a signal strength detection output whose linearity is poor is derived from the terminal 4 as shown in FIG. 2. In addition, since the signal is rectified by the base-emitter junction diode of the transistor, its temperature characteristic is disadvantageous. The capacitor (C8, C9, C10) in each rectifier requires a large capacitance for a low intermediate frequency. For this reason, the chip size of an integrated circuit for fabricating the respective capacitors becomes large. If the capacitors are connected externally, the necessary lead-out terminals are increased in number.

The linearity of the input signal detection voltage is improved by increasing the number of rectification cirucits. However, this increases the number of differential intermediate frequency amplifiers and the number of capacitors.

DETAILED DESCRIPTION OF THE INVENTION

Figure 3:
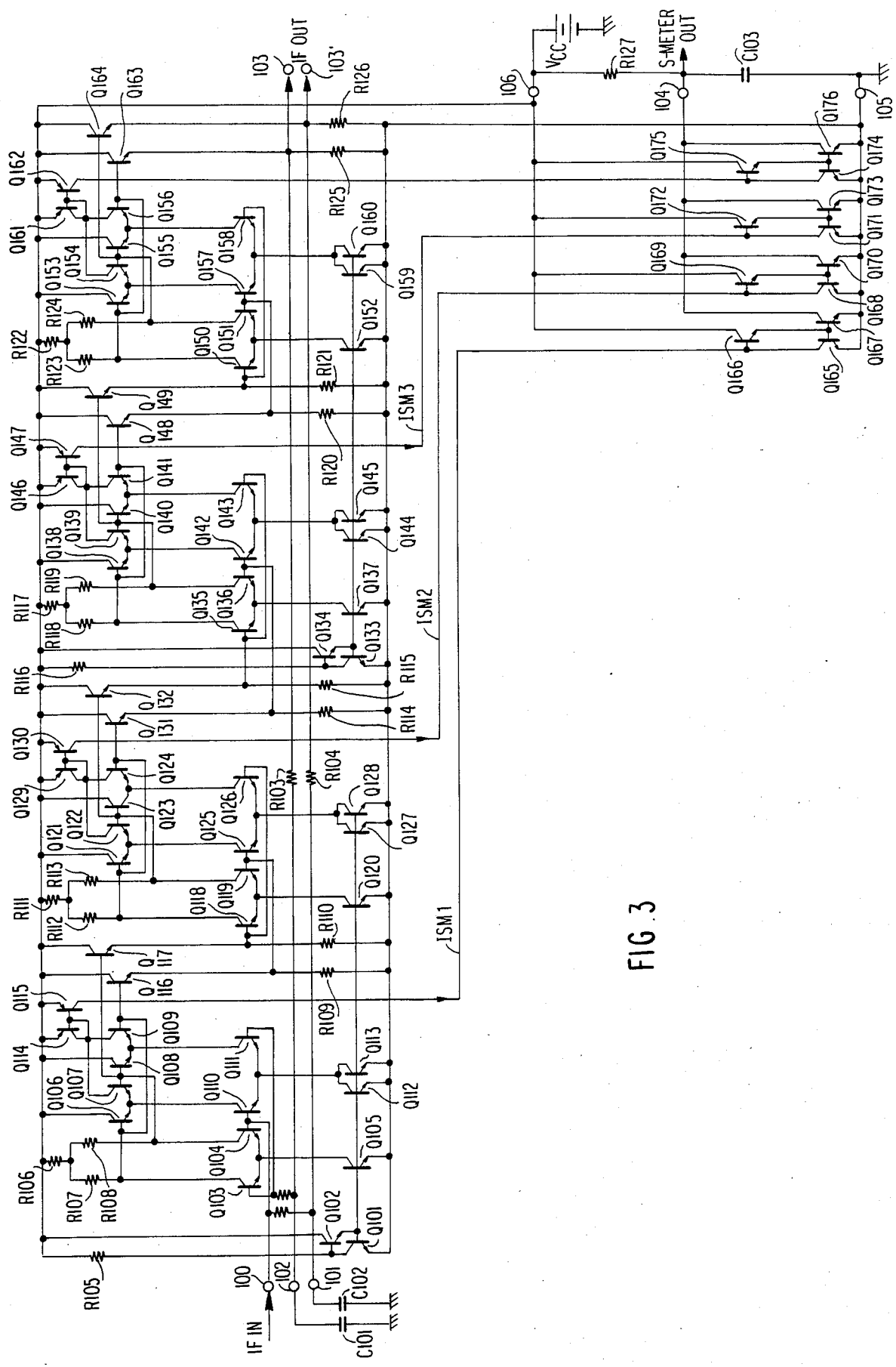
FIG. 3 is a circuit diagram showing a first embodiment of the present invention.

In FIG. 3, an intermediate frequency amplifier according to one embodiment of the present invention is shown. This amplifier is constituted of four differential amplifiers. An FM intermediate frequency signal is supplied through an input terminal 100 to the first differential amplifier. The first differential amplifier is composed of transistors Q103 to Q105 and resistors R106 to R108, and the FMIF signal is supplied to the base of the transistor Q104. The base of Q104 is connected through a resistor R101 to a first feedback terminal 101, and this terminal is grounded through a capacitor C102. The base of the transistor Q103 is connected through a resistor R102 to a second feedback terminal 102, and this terminal is grounded through a capacitor C101. The true and complementary signals of the first differential amplifier are supplied to a second differential amplifier through emitter-follower transistors Q116, Q117, respectively. The second differential amplifier is composed of transistors Q118 to Q120 and resistors R111 to R113. Similarly, the true and complementary output signals of the second differential amplifier are supplied respectively through emitter-follower transistors Q131, Q132 to a third differential amplifier which is composed of transistors Q135 to Q137 and resistors R117 to Q119, and the true and complementary output signals of the third differential amplifier are supplied respectively through emitter-follower transistor Q148, Q149 to a fourth differential amplifier which is composed of transistors Q150 to Q152 and resistors R122 to R124. The true and complementary output signals of the fourth differential amplifier are supplied to output terminals 103, 103' through emitter-follower transistors Q163, Q164 respectively.

The input and output signals of each differential amplifier are further supplied to respective full wave rectifiers. Each full wave rectifier is a double balanced differential circuit including a first differential circuit composed of transistors Q110 and Q111 (Q125 and Q126, Q142 and Q143, Q157 and Q158), a second differential circuit composed of transistors Q106 and Q107 (Q121 and Q122, Q138 and Q139, Q153 and Q154), and a third differential circuit composed of transistors Q108 and Q109 (Q123 and Q124, Q140 and Q141, Q155 and Q156). The first differential circuit is driven by a current source composed of transistors Q112 and Q113 (Q127 and Q128, Q144 and Q145, Q159 and Q160) and receives the input signals to each intermediate frequency amplifier. The second and third differential circuits are driven by the true and complementary outputs of the first differential circuit as current sources and receives the output signals from each intermediate frequency amplifier. The outputs of the second and third differential circuits are connected in common to the input terminal of a current mirror circuit composed of transistors Q114 and Q115 (Q129 and Q130, Q146 and Q147, Q161 and Q162). As a result, derived at the output of each double balanced differential circuit is a full-wave rectified signal of the output signal of each intermediate frequency amplifier. Moreover, this full wave rectifier is a differential circuit, and therefore this signal has no temperature dependency, and no capacitor is used for rectification. The outputs of the first to fourth current mirror circuits are supplied to a current adding circuit composed of transistors Q165 to Q176 and then converted into a voltage by a resistor R127 connected between a power supply terminal 106 and a terminal 104. A capacitor C103 removes a carrier wave signal, so that a signal strength detection signal is derived from the terminal 104. The circuit elements are formed as an integrate circuit except for the resistor R127 and the capacitors C101 to C103.

Since the full wave rectification currents $I_{SM1}$, $I_{SM2}$, $I_{SM3}$ and $I_{SM4}$ of the four full wave rectifier stages are equal in phase to one another, they are added linearly by the current adding circuit constructed of the transistors Q165 to Q176 to get $I_{SM}$ ($=I_{SM1}+I_{SM2}+I_{SM3}+I_{SM4}$).

Figure 4:
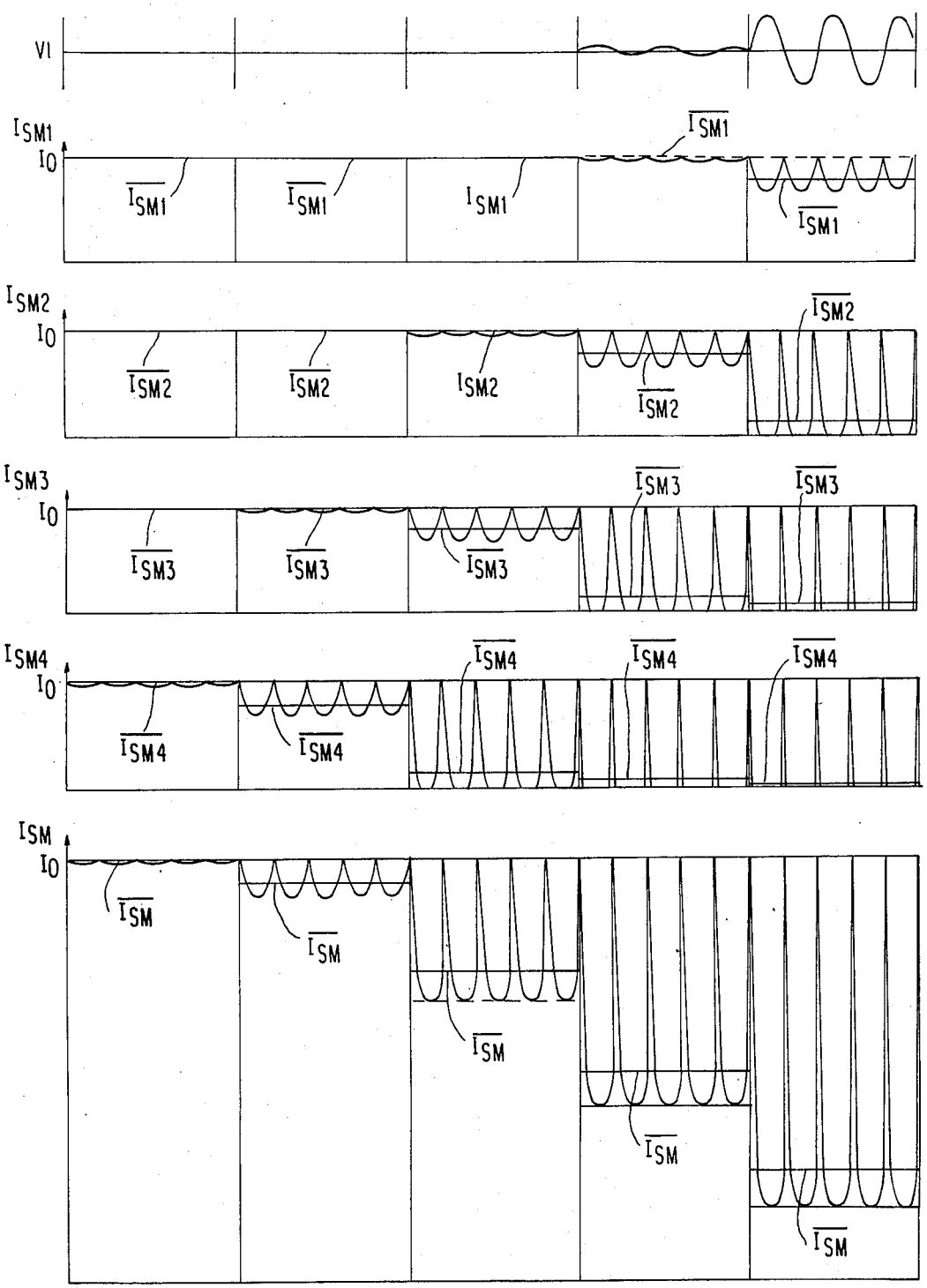
FIG. 4 is a wave form diagram representing an output current and field detection level of each stage double-wave rectifier with respect to an input voltage in the circuit of FIG. 1.
Figure 5:
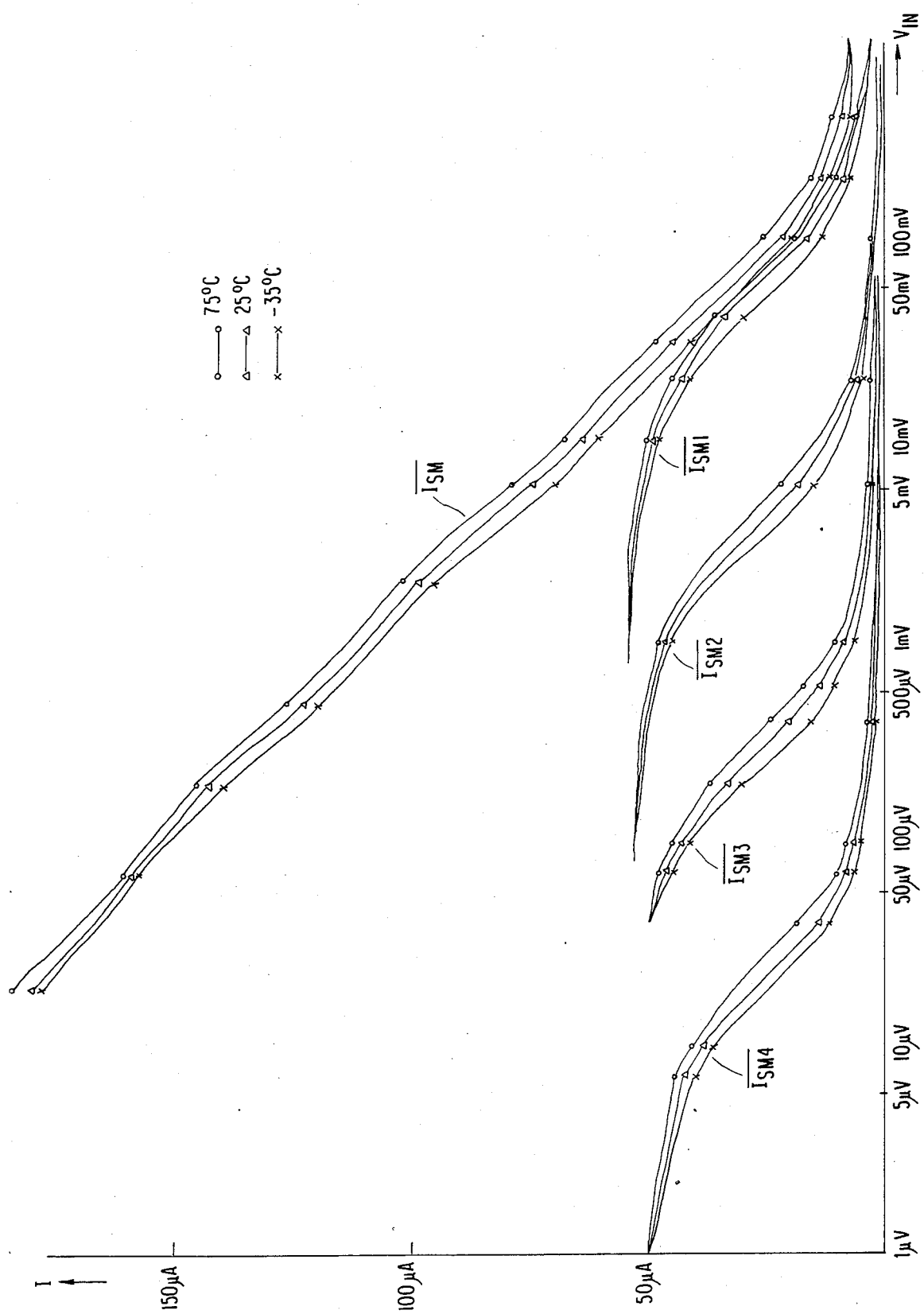
FIG. 5 is a graph representing an output current wave form of each stage rectifier and an added output current wave form of the respective rectification outputs with respect to an input signal level in the circuit of FIG. 1.

In FIG. 4, the output currents $I_{SM1}$ to $I_{SM4}$ of the respective full wave rectifiers and the current $I_{SM}$ representing an electric field strength detection level are shown. In addition, average values $I_{SM1}$, $I_{SM2}$, $I_{SM3}$, $I_{SM4}$ and $I_{SM}$ of each current are also indicated. Thus, since the output of each intermediate frequency amplifier is full-wave rectified, its rectification efficiency is high. Accordingly, the respective full wave rectification currents corresponding to the magnitude of the FMIF signal $V_1$ are represented by $I_{SM1}$ to $I_{SM4}$ in FIG. 5, and their additive current $I_{SM}$ is improved considerably in linearity. The characteristics shown in FIG. 5 are under the conditions that the gain of each differential amplifier in the IF amplifier stage is 22 dB and the power supply voltage is 5 V. Further, in FIG. 5, the respective currents $I_{SM1}$ to $I_{SM4}$ and $I_{SM}$ at temperatures of $T=-35°$ C., and 75° C. are also shown under the condition that the temperature coefficient of each resistor is +2000 ppm/° C., from which it will be seen that the temperature characteristics are superior.

Figure 6:
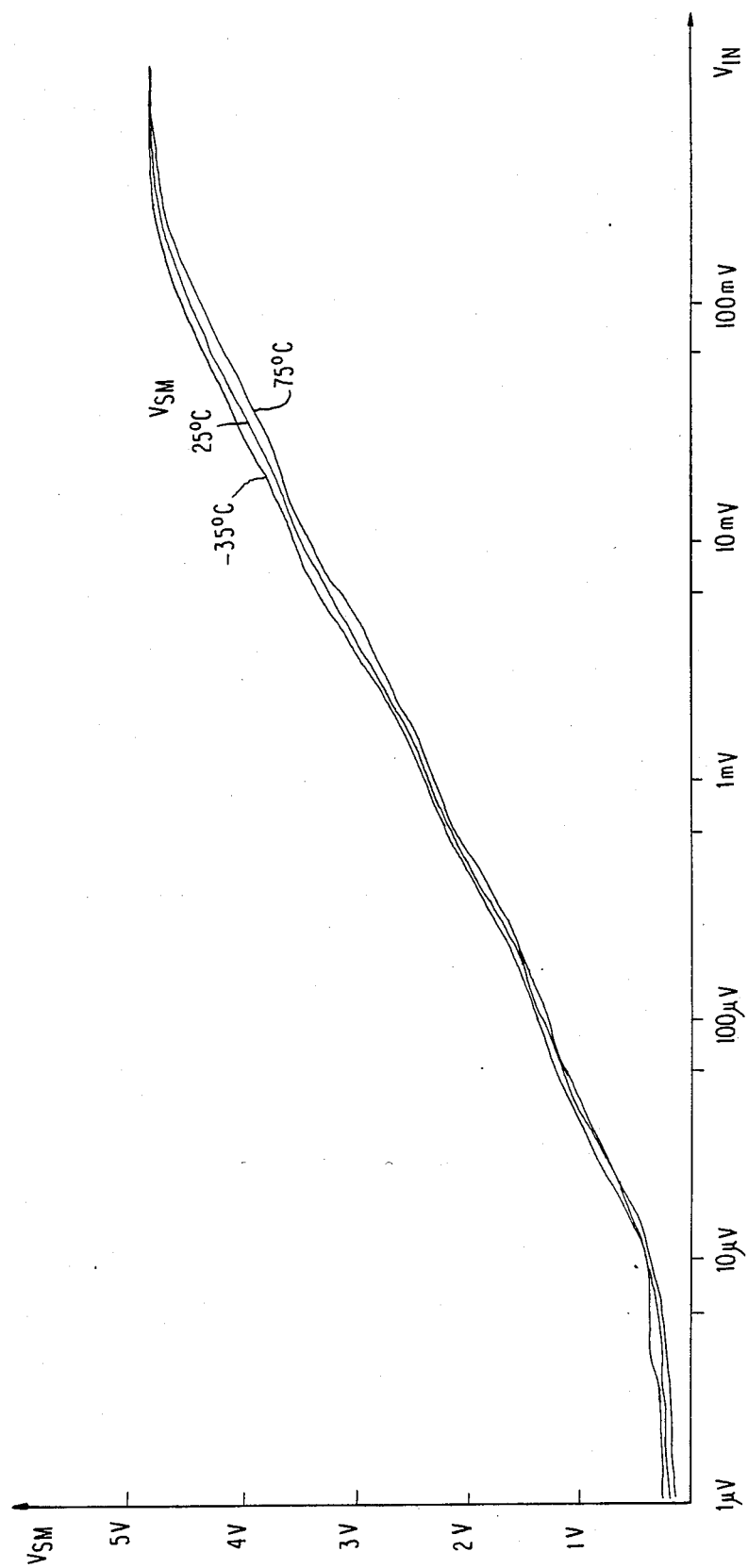
FIG. 6 is a graph representing an added voltage wave form of the addition circuit with respect to the input signal level in the circuit of FIG. 1.

In FIG. 6, the voltage waveform converted by the resistor R27 from the electric field strength detection current $I_{SM}$ is shown.

Figure 7:
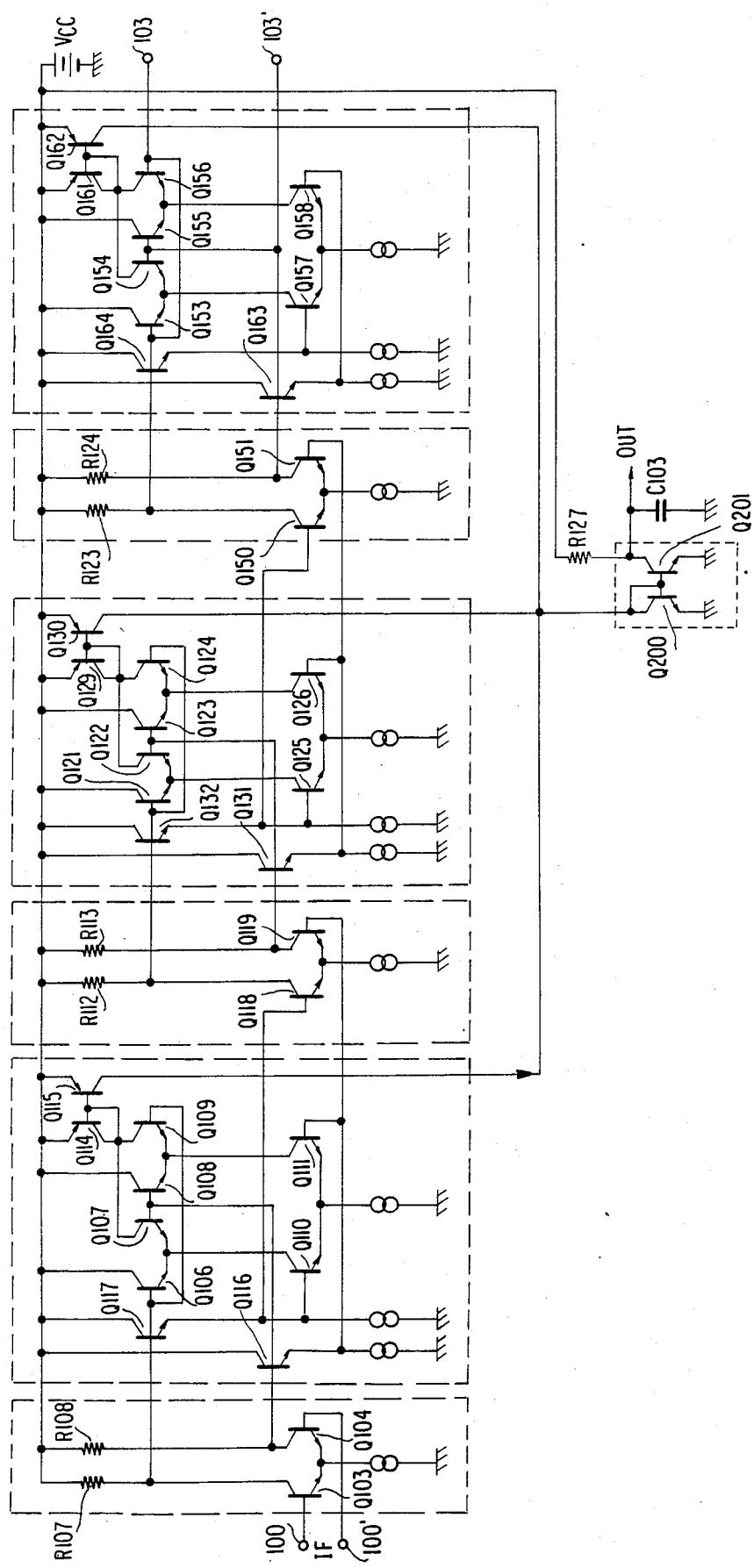
FIG. 7 is a circuit diagram showing a second embodiment of the present invention.

FIG. 7 shows a second embodiment of the present invention, in which the same constituents as those in FIG. 3 are denoted by the same reference characters. In this embodiment, the first differential circuit in the double balanced full wave rectifier is not supplied with the input signals of each intermediate frequency amplifier 1, but is supplied with the true and complementary output signals therefrom through emitter-follower transistors (Q116 and Q117, Q131 and Q132, Q163 and Q164). In other words, each full wave rectifier receives only the output signals of each intermediate frequency amplifier and produces the full wave rectification signal thereof.

In FIG. 7, the intermediate frequency amplifier constructed by three stage differential amplifiers is shown, but it may be four stage construction in FIG. 3. Although the respective full wave rectification outputs are added by a current mirror circuit composed of transistors Q200, Q201, they may be added by the construction such as FIG. 3.

As described above, since the intermediate frequency amplifier stage according to the present invention receives the input and output signals or the output signals of each intermediate frequency amplifier and addes its full wave rectification output, the added output as a signal strength detection signal has good linearity, and further a wide dynamic range is obtained. Moreover, since the double balance differential circuit is employed as each full wave rectifier, the temperature characteristics are superior, and since no capacitor is necessary, it is suitable for an integrated circuit.

In the following, other embodiments of the present invention will be described, and the same constituents as the embodiments shown in FIGS. 3 and 7 are denoted by the same characters to omit their explanation.

Figure 8:
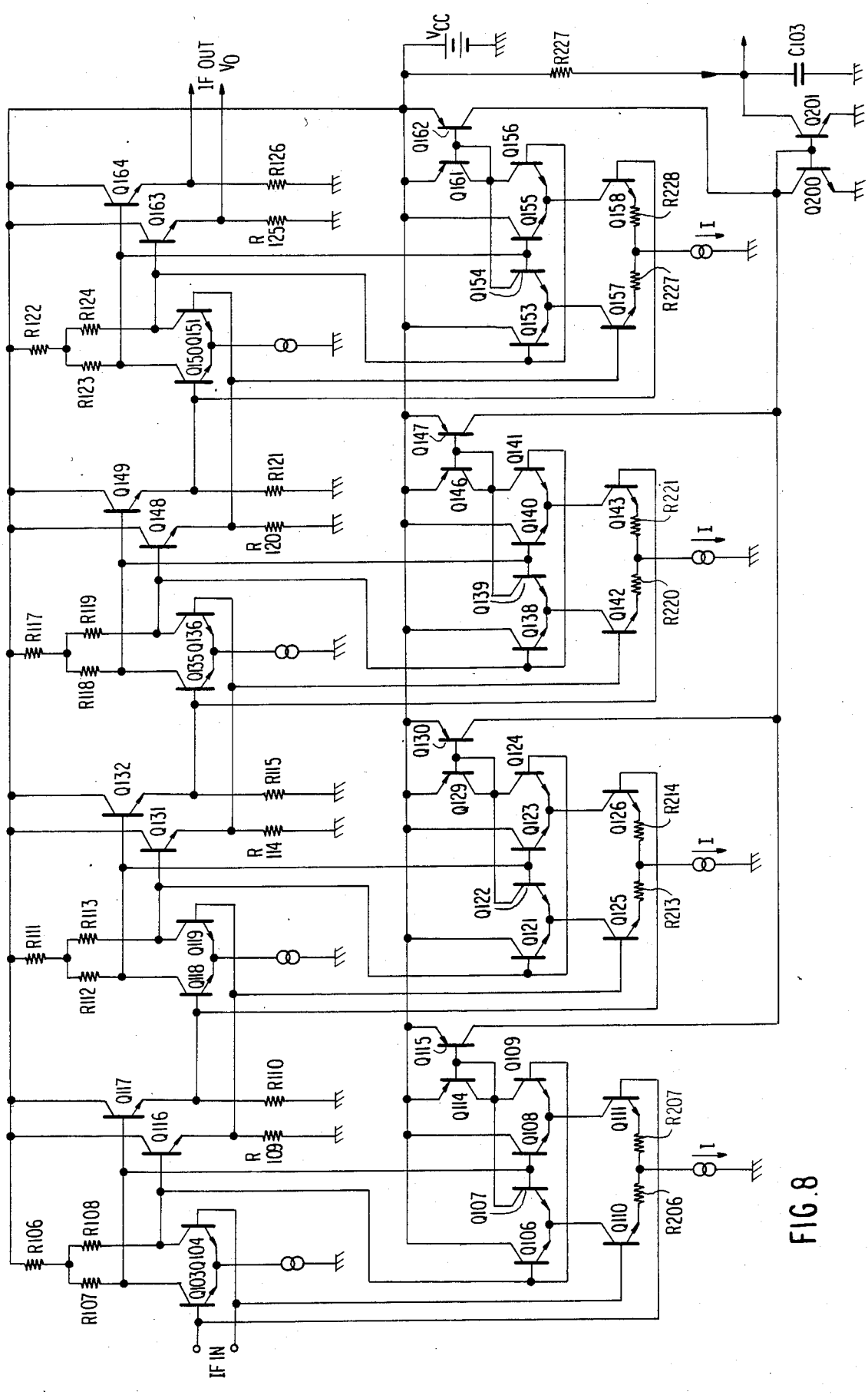
FIG. 8 is a circuit structure diagram showing a third embodiment of the present invention.

FIG. 8 shows a third embodiment of the present invention. As compared to the intermediated frequency amplifier stage shown in FIG. 3, emitter resistors R206 and R207 (R213 and R214, R220 and R221, R227 and R228) are inserted between the respective emitters of the input pair transistors Q110 and Q111 (Q125 and Q126, Q142 and Q143, Q157 and Q158) constituting the first differential circuit in the double balanced differential circuit as a full wave rectifier. As a result, the gain of each double balanced differential circuit is lowered, while the saturation level of each double balanced differential circuit is increased by the lowering of the gain. Accordingly, the detection range of the received electric field strength is broadened.

The respective resistance values of the resistors R206, R207, R213, R214, R220, R221, R227, R228 are equal to one another, and this is represented by RE. In addition, the first differential circuit in each double balanced differential circuit is driven by the current source with a current of I, and the gains of the respective intermediate frequency amplifier are equal to one another and to those in FIG. 3. As a result, the rectification range of each full wave rectifier is broadend by a voltage level g represented by a following equation (1):

$$g = \frac{2V_T + R_E/I}{2V_T} \quad (1)$$

where $V_T$ is KT/q (K: BoHzman Constant, T: an absolute temperature, q: an electron). Accordingly, the received electric field strength detection range is thus broadened by the insertion of the emitter resistors.

Figure 9:
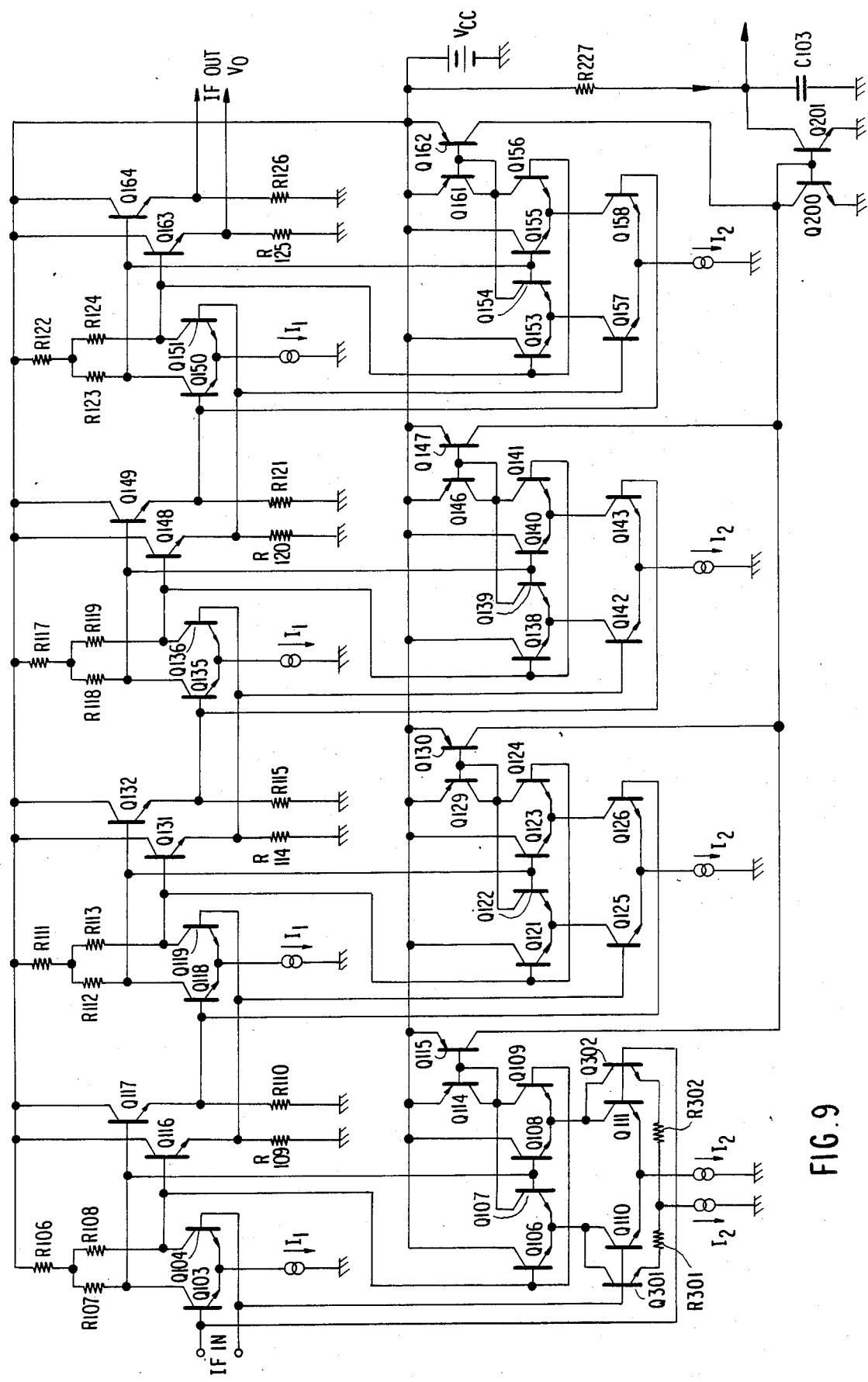
FIG. 9 is a circuit diagram showing a fourth embodiment of the present invention.

FIG. 9 shows a fourth embodiment of the present invention. In this embodiment, there is one additional differential circuit whose input and output are connected in common and whose gain is different with respect to the first differential circuit in the first state double balanced differential circuit. This additional differential circuit is composed of transistors Q301, Q302 and their emitter resistors R301, R302, and driven by a current source of a current I₂. This structure is equivalent to a structure in which a full wave rectifier is increased by one, and the detection range is further expanded. Particularly, since the additional differential circuit is provided in the first stage double balanced differential circuit, the electric field strength is detected to a considerably strong range.

Figure 10:
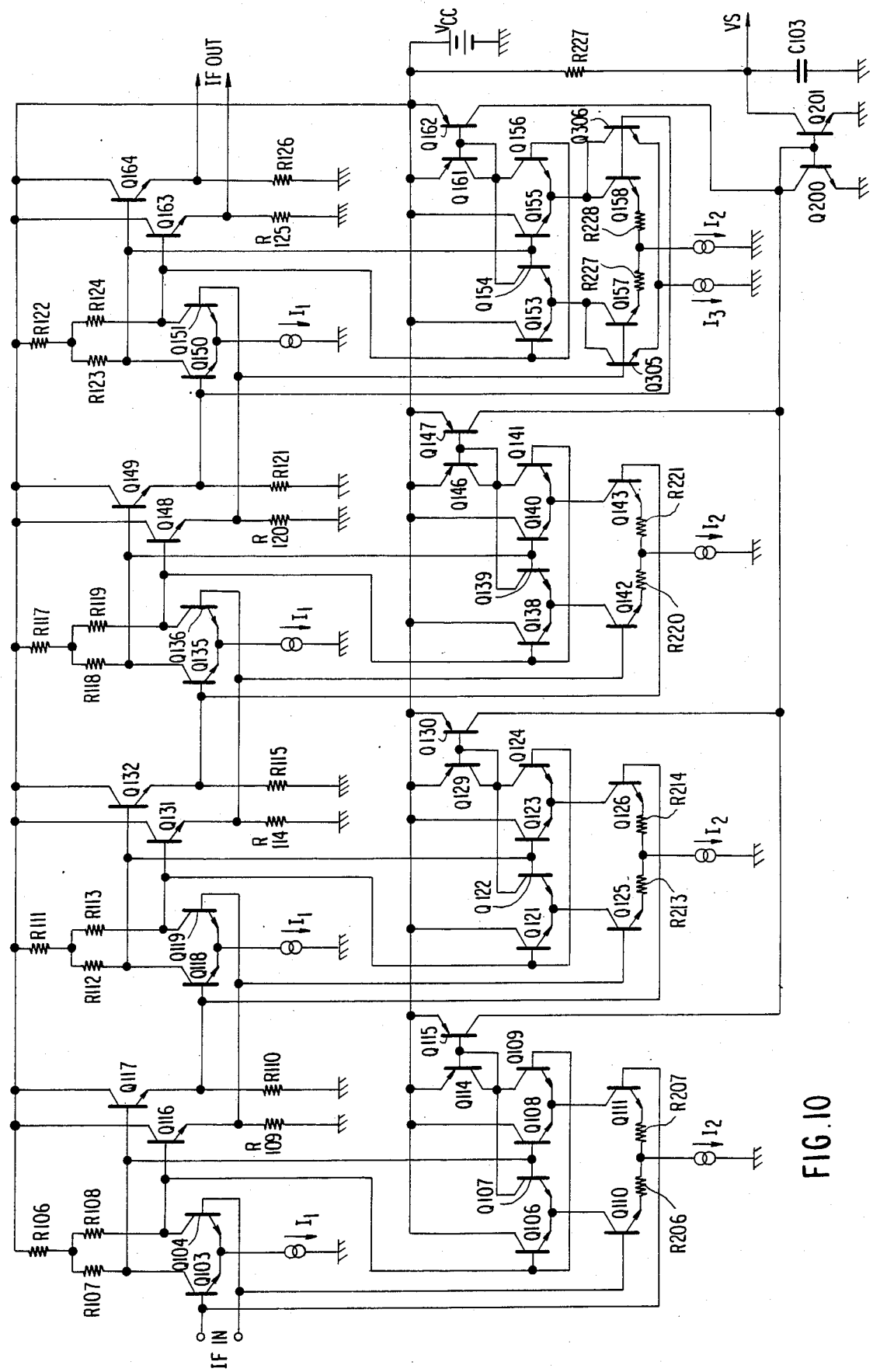
FIG. 10 is a circuit diagram showing a fifth embodiment of the present invention.

FIG. 10 shows a fifth embodiment. In this construction, an additional differential circuit composed of transistors Q305 and Q306 is provided in the last stage double balanced differential circuit in the embodiment shown in FIG. 8. Accordingly, the input electric field strength is detected to a considerably weak range. In other words, the input detection sensitivity is improved.

Figure 11:
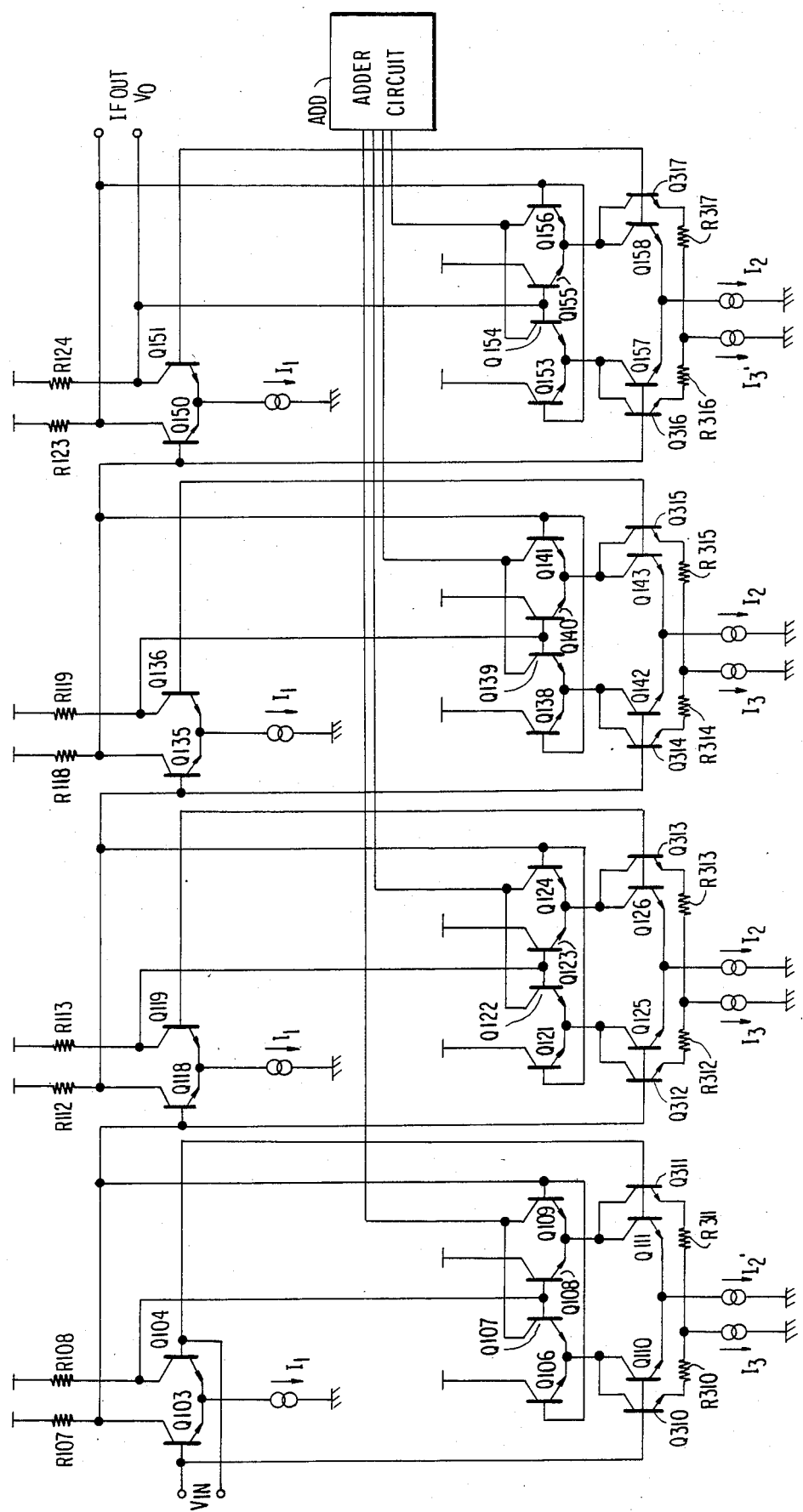
FIG. 11 is a circuit diagram showing a sixth embodiment of the present invention.

In FIG. 11, a sixth embodiment of the present invention is shown. A differential circuit composed of transistors Q310 and Q311 (Q312 and Q313, Q314 and Q315, Q316 and Q317) and resistors R310 and R311 (R312 and R313, R314 and R315, R316 and R317) is provided in parallel to the first differential circuit in each double balanced differential circuit shown in FIG. 3 as a full wave rectifier.

As the IF input signal $V_{IN}$ becomes larger, the double balanced differential amplifiers are saturated in order from the last stage. Assuming now that R310=R311=.

...R317=$R_E$ and that the current sources in the respective double balanced differential amplifiers produce the same current I, the gains g11, g21, g31, g41 of the differential circuits constituted respectively of transistors Q110 and Q111, Q125 and Q126, Q142 and Q143, Q157 and Q158 are equal to one another and represented by the following equation:

$$g11\ (g12, g13, g14) = I/2\ V_T \qquad (2)$$

The gains g12, g22, g32, g42 of the differential circuits composed of transistors Q310 and Q311, Q312 and Q313, Q314 and Q315, Q316 and Q317 are also equal to one another and represented by the following equation:

$$g12\ (g22, g32, g42) = I/(2\ V_T + R_E I) \qquad (3)$$

It is understood that the gains can be controlled by the respective emitter resistors R310 to R317. Accordingly, the following relationship can be obtained by the resistance values of the emitter resistors R310 to R317, the gains of the first to fourth intermediated frequency amplifiers being g0.

$$g11\ (g21, g31, g41) = \sqrt{g0 \cdot g12\ (g22, g32, g42)} \qquad (4)$$

Figure 12:
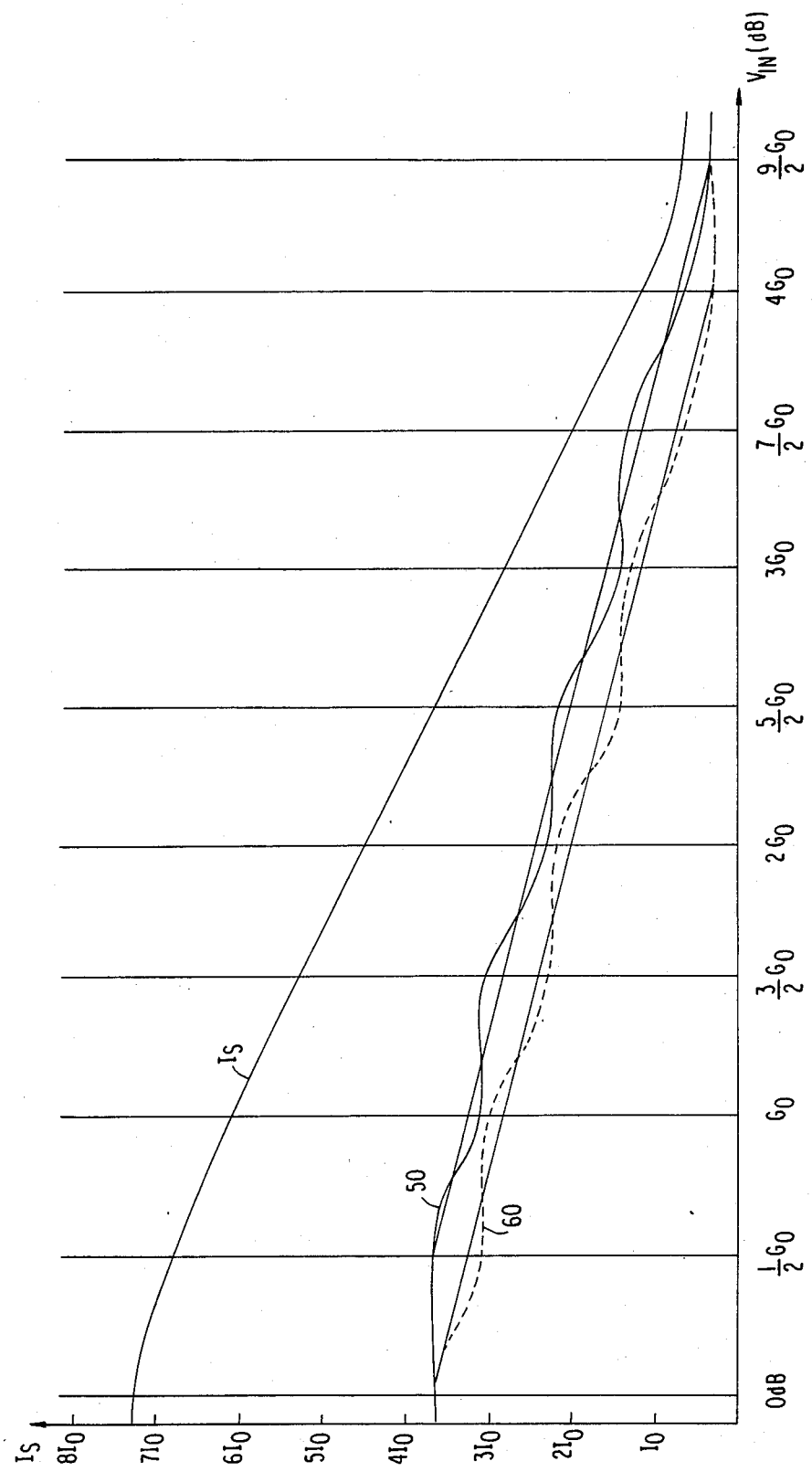
FIG. 12 is a graph representing an addition characteristic of rectification outputs in the circuit of FIG. 11.

As a result, the signal strength detection current $I_S$ obtained by the construction of FIG. 11 represents excellent linearity as shown by $I_S$ in FIG. 12. In FIG. 12, GO denoted in an abscissa is : GO (dB)=20 log g0.

Explaning in more detail, the construction shown in FIG. 11 is equivalent to a construction equipped with four full wave rectifiers having the gain represented by the equation (2) and four full wave rectifiers having the gain represented by the equation (3). Assuming that only the formar full wave rectifiers are provided, its output characteristic is represented by a curve 50 in FIG. 12. In the case of only the latter full wave rectifiers, the output characteristic is denoted by a curve 60 in FIG. 12. The difference between the curves 50 and 60 is based on the presence of the emitter resistors R310 to R317, and the sensitivy of the rectifier having the emitter resistors is lowered by GO/2 (dB). Accordingly, the curves 50, 60 represent waved characteristics, as shown in FIG. 12.

Generally speaking, in the case where a logarithmic characteristic curve is approximated to a bent line by a linear amplifier, the deviation from the logarithmic characteristic occurs inevitably, as shown by curves 50, 60 in FIG. 12. In order to lower this deviation from the logarithmic characteristic, it is well known that increasing in number the bent portion of the bent line is only one way. On the other hand, in the circuit of FIG. 11, two transistor pairs Q110, Q111 and Q310, Q311; Q125, Q126 and Q312, Q313; Q142, Q143 and Q314, Q315; Q157, Q158 and Q316, Q317 constituting the double balance differential circuit of each stage operate at the same phase, respectively. Accordingly, the electric field strength detection output current $I_S$ is obtained by adding the curve 50 and the curve 60. As shown in FIG. 12, since the emitter resistors R310 to R317 are designed such that the convex (or concave) portions of the curve 50 overlap the concave (or convex) portions of the curve 60, the undulation of the curve 50 and that of the curve 60 are cancelled each other. As a result, the linearity of the electric field strength detection output current $I_S$ is improved.

Figure 13:
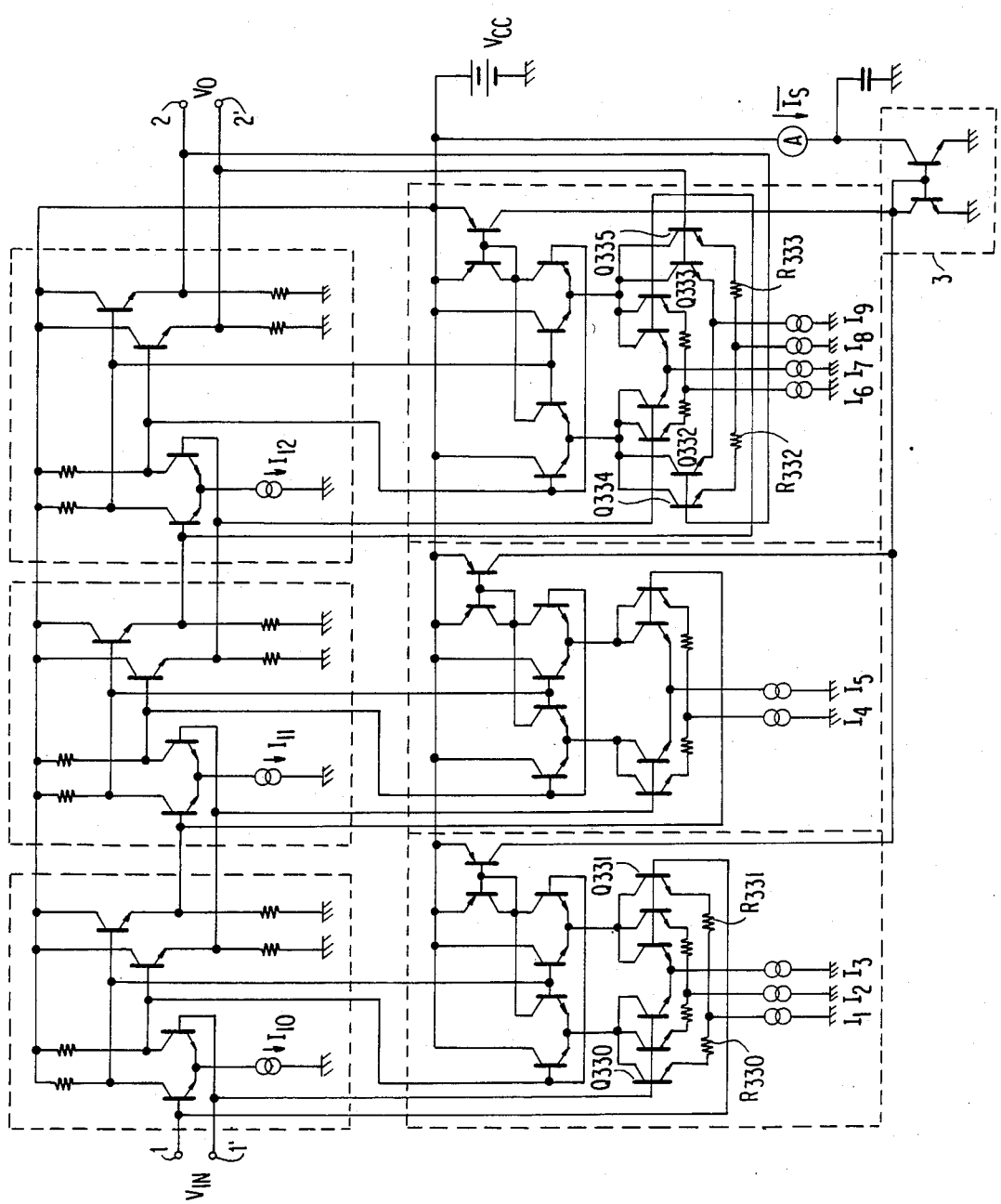
FIG. 13 is a circuit diagram showing a seventh embodiment of the present invention.

In FIG. 13, a seventh embodiment of the present invention is shown. In this embodiment, the dynamic range is further broadened and the linearity of the detection output is further improved. As compared to FIG. 11, a differential circuit composed of transistors Q330, Q331 and emitter resistors R330, R331 is further added to the first stage double balanced differential circuit. In addition, a differential circuit composed of transistors Q332 and Q333 and a differential circuit composed of transistors Q334, Q335 and resistors R332, R333 are further added to the last stage double balanced differential circuit. The two differential circuits added to the last stage differential circuit are supplied with the true and complementary output signals of the last stage intermediate frequency amplifier through emitter-follower transistors Q163, Q164.

Figure 14:
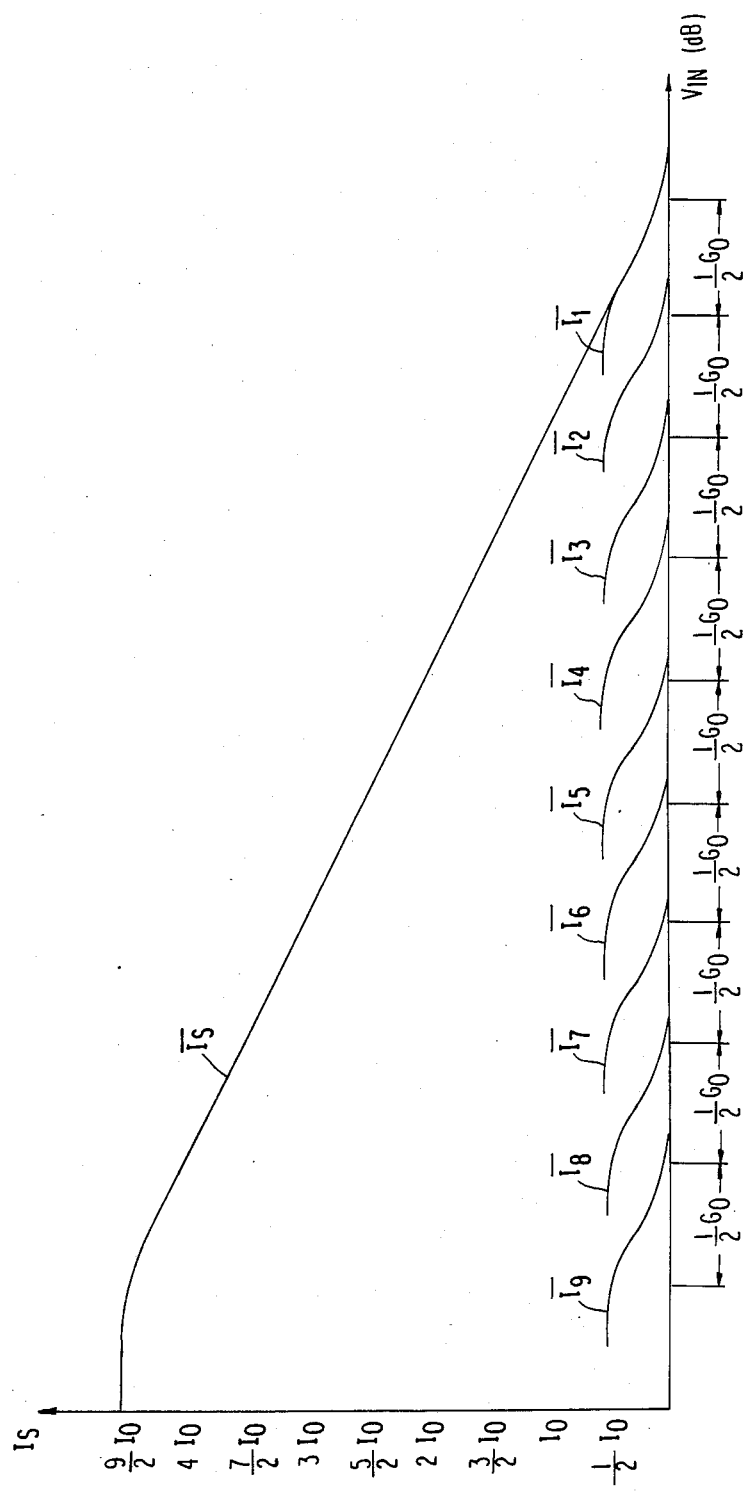
FIG. 14 is a graph representing the respective rectification output currents and an added output currents

As a result, the intermediate frequency amplifier stage shown in FIG. 13 is equipped with nine full wave rectifiers with respect to three intermediate frequency amplifiers. Accordingly, as apparent from FIG. 14, the dynamic range of the detectable input signal $V_{IN}$ assumes 9/2 GO dB, a sufficient wide dynamic range is ensured. Further, eleven full wave rectifiers is saturated in the order even when the input signal $V_{IN}$ increases by ½ GO (db), and therefore the deviation of the electric field detection output from the logarithmic characteristic becomes very small.

Figure 15:
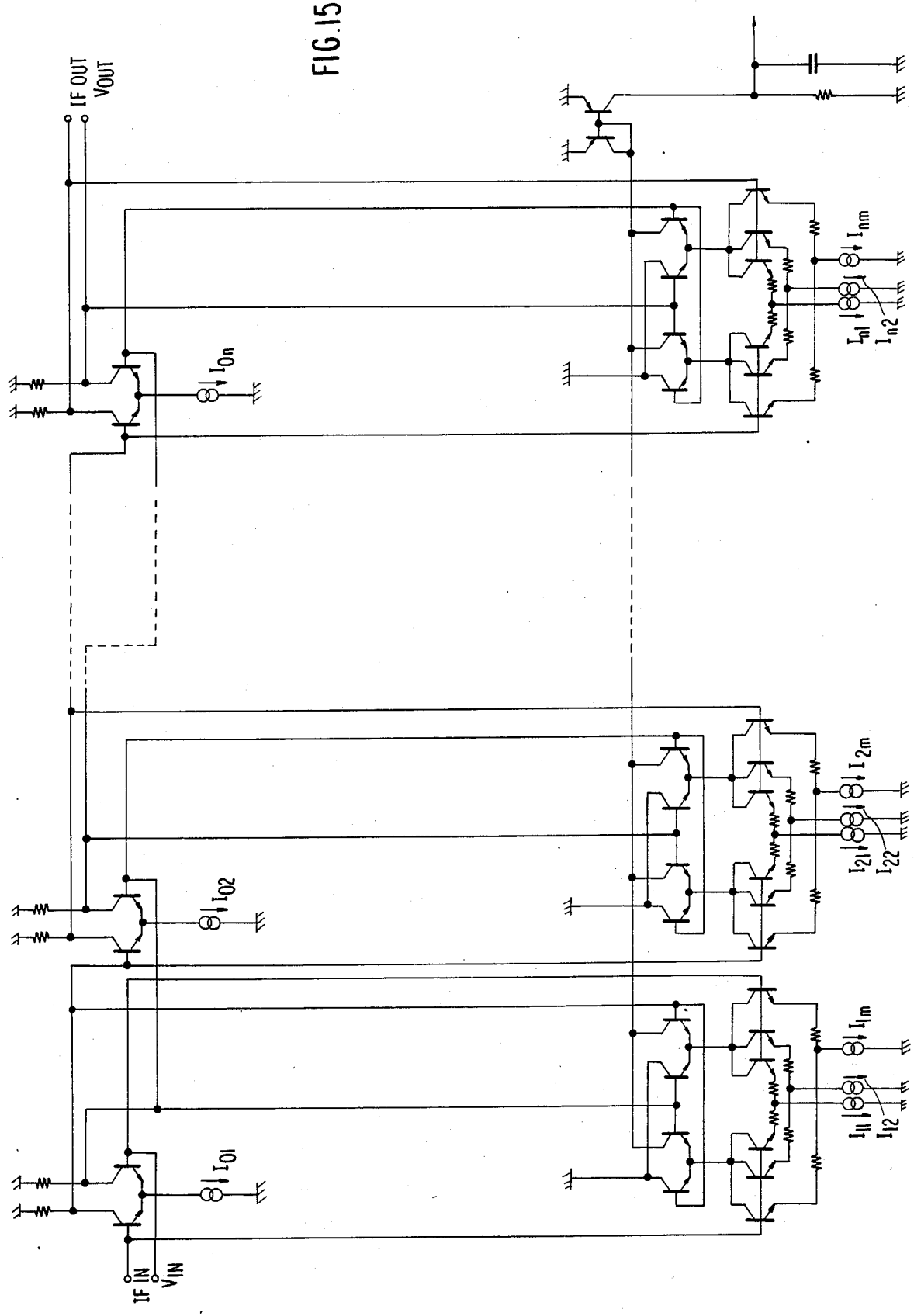
FIG. 15 is a circuit diagram showing an eighth embodiment of the present invention.

FIG. 15 shows an eight embodiment of the present invention. In order to broaden the input dynamic range and to improve the linearity of the detection output, in the foregoing embodiments, at least one differential circuit having no emitter resistor and at least one differential circuit having emitter resistor are connected in parallel. However, the deviation in the characteristics occurs slightly between the former differential circuit and the latter differential circuit because of the presence and absence of the emitter resistors. For this reason, although the considerably improved linearity of the detection output is obtained in the above embodiments, it is favorable to employ the differential circuit of the same construction in order to obtained the further excellent linearity. Accordingly, in the construction shown in FIG. 15, the first differential circuit in each double balanced differential amplifier is constituted by a plurality of differential circuits all having emitter resistors. Assuming that the emitter resistor is $R_E$ and the current of the current source is I, the gain g of each differential circuit having the emitter resistors is represented as follows:

$$g = \frac{I}{2V_T + R_E I}$$

Therefore, various gains can be obtained by controlling the resistance value $R_E$ of the emitter resistor. When the first differential circuit in each double balanced differential circuit is constituted of m pieces of differential circuits, the resistance value of the emitter resistor in each differential circuit is designed such that the gains g1, g2, ..., gm of the respective differential amplifiers assume the relationship g1<g2<...<gm. Further, assuming that the gain of each intermediate frequency amplifier is g0, the respective gains of m pieces of the differential circuits are designed to be different from one another by $\sqrt{g0}$.

Accordingly, the full wave rectifiers are saturated in order from the last stage in accordance with the increase in the input signal $V_{IN}$, and in the respective stages, the differential circuits are saturated from the mth stage. The differential circuit saturating last is the first differential circuit in the first full wave rectifier. Moreover, the sequential saturation occurs even when the input signal level increases by $\sqrt{g0}$ multiplication. In other words, the construction in FIG. 15 is equivalent to n×m pieces of full wave rectifiers whose saturation levels are different from one another by $\sqrt{g0}$ multiplication.

The gain $G_{IF}$ of the IF amplifier is: $G_{IF}=g0^n$. For example, in the construction in FIG. 15, assuming that n (the number of the intermediate frequency amplifiers)=5, m (the number of the first differential circuits)=3 and 20 log g0=21 dB, we get $G_{IF}=20$ log $g0^n=105$ dB, 20 log $\sqrt{g0}=7$ dB. The dynamic range in the logarithmic characteristic at this time is m×n×20 log$\sqrt{g0}$ =105 dB. The accuracy (logarithmic error) is ±0.1 dB with respect to the input signal level $V_{IN}$.

Thus, according to the construction in FIG. 15, there is provided a logarithmic IF amplifier having a high saturation level, high accuracy and a wide dynamic range. The temperature characteristics of the logarithmic characteristic are determined by the temperature characteristic of the current source and that of the resistors, and thus the temperature characteristics can be small sufficiently.

Figure 16:
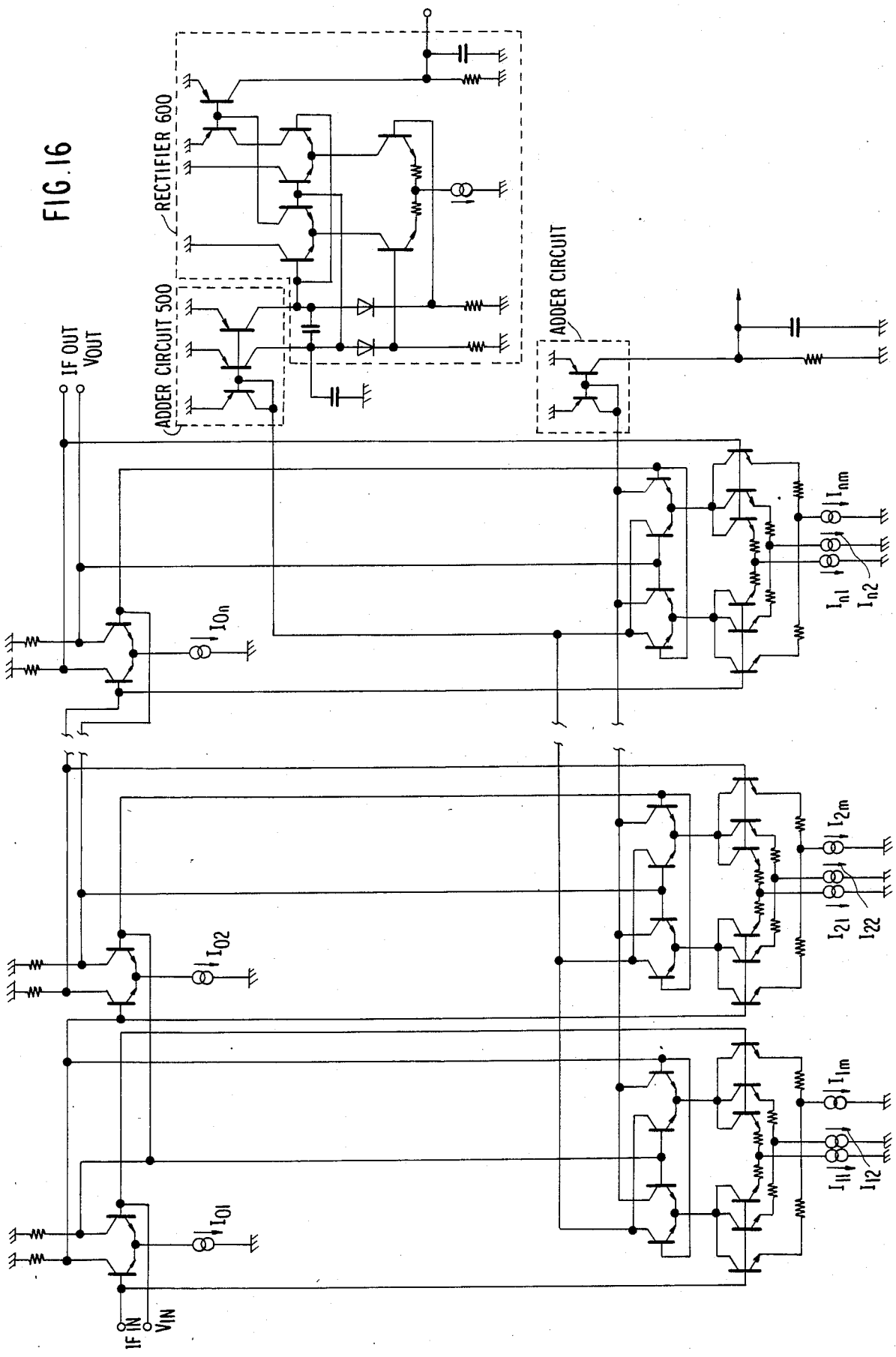
FIG. 16 is a circuit diagram showing a ninth embodiment of the present invention.

FIG. 16 is a circuit diagram showing a ninth embodiment which has a beat detection function by providing a second adder circuit 500 adding the opposite phase output currents of the respective double balance differential and rectification circuit 600 rectifies this added output in the construction in FIG. 13.

An automobile subscriber station or a car tuner requires not only a received electric field detection function but also a beat detection function. In prior art, the beat detection has been carried out by employing an AGC amplifier. However, in the beat detection employing the AGC amplifier, there is a problem in the design of a loop circuit time constant caused by using a negative feedback circuit, so that an abnormal oscillation frequency occurs in the loop circuit. Moreover, the deterioration in the S/N ratio upon a high speed driving is remarkable due to the restriction in the response time of the AGC loop. Furthermore, the minimum value of the detectable beat frequency is determined by the time constant of the AGC loop, and hence the beat detection at a low frequency is impossible and further the beat detection over a wide dynamic range and the detection of a low level beat component are difficult.

In the present embodiment, the beat detection is carried out by employing the opposite phase output of each rectifier in order to solve such problems in prior art. The second adder circuit 500 is constituted of transistors Q003, Q004 and Q005 and addes the opposite phase output currents of the first to nth full wave rectifiers. In the rectification circuit 600, a capacitor C003 removes the carrier wave component of an intermediate frequency, and further a capacitor C002 removes all the alternate current components. Transistors Q006 to Q013, diodes D001, D002 and resistors R002 to R006 constitute a full wave rectifier rectifying and detecting the beat component and a multi-pass component which are in turn filtered by a resistor R006 and a capacitor C004 to be outputted as a beat detection voltage $V_{BEAT}$.

The beat component is defined as an alternate current signal level which is subjected to be AM-modulated at a beat frequency due to the jamming of two waves.

Figure 17:
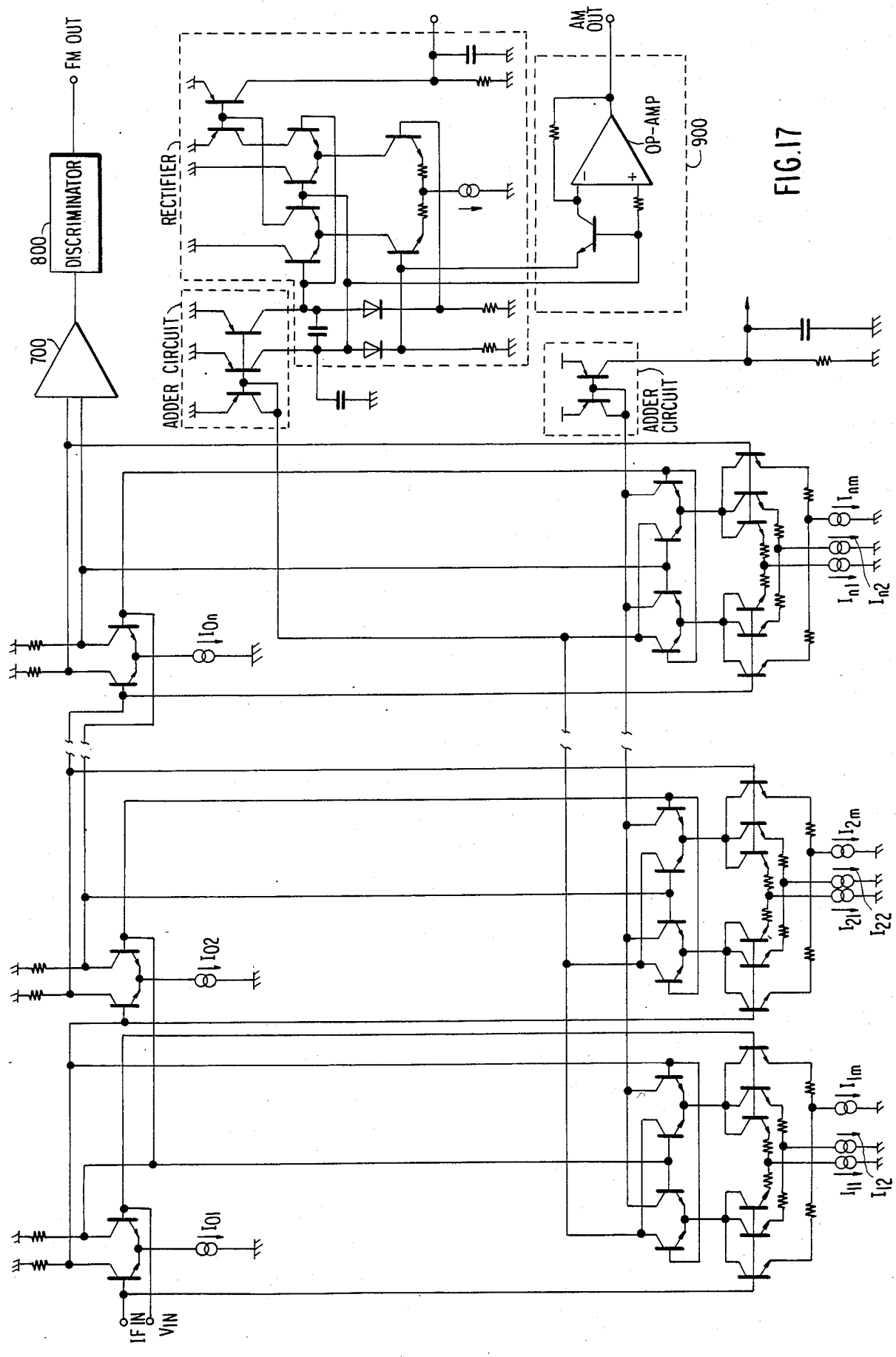
FIG. 17 is a circuit diagram showing a tenth embodiment of the present invention.

FIG. 17 is a circuit diagram showing a tenth embodiment and is applied to an AM/FM tuner. A limiter amplifier 700 is connected to the output of the IF amplifier, and the output of the limiter 700 is supplied to a discriminator 800. Accordingly, an FM detection signal is derived from the discriminator. On the other hand, the signal to the rectification circuit 600 is also supplied to a reverse-logarithm conversion circuit 900 and is treated with the reverse-logarithm conversion, so that an AM detection signal is obtained.

By sufficiently increasing the gain of the limiter amplifier 700, the suppression of an AM component is effective to derive the sufficiently good FM demodulation output from the output of the discriminator 800.

On the other hand, as has described in detail with respect to FIG. 15, since the accuracy of the logarithmic characteristic (logarithmic error) can be realized with sufficiently high accuracy, the AM detection output having sufficient linearity is derived by supplying added opposite-phase signals of the respective full wave rectifiers to the reverse-logarithm conversion circuit 900 to carry out the reverse-logarithm conversion, so that the AM signal is demodulated.

Thus, according to the construction in FIG. 17, an intermediate frequency amplifier stage for the AM signal is not necessitated.

In the present invention, various modifications are possible except for the above-mentioned embodiments.

What is claimed is:

1. An intermediate frequency amplifier stage, comprising: a plurality of intermediate frequency amplifiers each including a differential amplifier, a plurality of double balanced differential circuits individually coupled to input and output terminals of an associated differential amplifier in the intermediate frequency amplifier for full-wave rectifying the output of a corresponding intermediate frequency amplifier, and an adder circuit for adding rectification outputs of the respective double balanced differential circuits.

2. The intermediate frequency amplifier stage of claim 1, wherein each of said double balanced differential circuits includes first, second and third differential circuits said first differential circuit having input termi coupled to an associated intermediate frequency amplifier and two output terminals coupled to current supply terminals of said second and third differential circuits, respectively, said second and third differential circuits having input terminals coupled to the associated intermediate frequency amplifier and output terminals connected to common to each other.

3. The intermediate frequency amplifier stage of claim 2, wherein at least one of said double balanced differential circuits further includes at least one fourth differential circuit, input and output terminals of said fourth differential circuit being connected in common to the input and output terminals of said first differential circuit.

4. The intermediate frequency amplifier stage of claim 1, wherein said adder circuit includes a first adder adding true-phase components of the rectified outputs of said double balanced differential circuits, and a second adder adding opposite-phase components of said rectified outputs.

5. An intermediate frequency amplifier stage, comprising:
a plurality of intermediate frequency amplifiers, means for coupling said intermediate frequency amplifiers in series, a plurality of rectifiers each comprising a double balanced differential circuit having first, second and third differential circuits and individually coupled to an associated intermediate frequency amplifier, and an adder coupled to output terminals of the respective double balanced differential circuits for adding rectified outputs thereof, each of said first differential circuits having input terminals coupled to terminals selected from the group consisting of input and output terminals of the associated intermediate frequency amplifier, and first and second output terminals, said second and third differential circuits having input terminals coupled to the output terminals of the associated intermediate frequency amplifier, said second and third differential circuits being driven by currents derived from the first and second output terminals of said first differential circuit, respectively, and the output terminals of said second and third differential circuits being connected in common to an input terminal of said adder.

6. The intermediate frequency amplifier stage of claim 5, wherein said first differential circuit includes first and second transistors, said second differential circuit includes third and fourth transistors whose emitters are connected to the collector of said first transistor, said third differential circuit includes fifth and sixth transistors whose emitters are connected to the collector of said second transistor, and the collectors of said fourth and sixth transistors are connected to the input terminal of said adder.

7. The intermediate frequency amplifier stage of claim 6, wherein said first differential circuit further includes first and second resistors connected in series between the emitters of said first and second transistors.

8. The intermediate frequency amplifier stage of claim 6, wherein each of said rectifiers has an additional output terminal, the collectors of said third and fifth transistors being connected to said additional output terminal.

9. A combination, comprising: a pair of input terminals receiving an intermediate frequency signal, a pair of output terminals outputting an amplified intermediate frequency signal, a first differential amplfiier having first and second input ends connected respectively to said pair of input terminals and first and second output ends, a first emitter follower transistor having an input end connected to the first output end of said first differential amplifier and an output end connected to one of said output terminals, a second emitter follower transistor having an input end connected to the second output end of said first differential amplifier and an output end connected to another of said output terminals, a rectification output terminal outputting a full-wave rectified intermediate frequency signal, a second differential amplifier having first and second input ends connected to said pair of input terminals and first and second output ends, a third differential amplifier having first and second input ends connected respectively to the input ends of said first and second emitter follower transistors, a common end connected to the first output end of said second differential amplifier and an output end connected to said rectification output terminal, and a fourth differential amplifier having first and second input ends connected respectively to the input ends of said first and second emitter follower transistors, a common end connected to the second output end of said second differential amplifier and an output end connected to said rectification output terminal.

10. The combination as claimed in claim 9, further comprising a fifth differential amplifier having first and second input ends connected to said pair of input terminals and first and second output ends connected respectively to the first and second output ends of said second differential amplifier.

11. An intermediate frequency amplifier stage, comprising: a plurality of intermediate frequency amplifiers coupled in series, each of said intermediate frequency amplifiers including first and second signal input terminals, first and second signal output terminals, a differential amplifier having first and second input terminals connected respectively to said first and second signal input terminals and first and second output terminals, a first emitter follower transistor connected between the first output terminal of said differential amplifier and said first signal output terminal, and a second emitter follower transistor connected between the second output terminal of said differential amplifier and said second signal output terminal; a plurality of full-wave rectifiers each having a rectification output terminal, a first one of said full-wave rectifiers including first, second, third, fourth and fifth differential circuits each having first and second input terminals and first and second output terminals, the first input terminals of said first, second and third differential circuits being connected in common to said first signal input terminal of a first one of said intermediate frequency amplifiers, the second input terminals of said first, second and third differential circuits being connected in common to said second signal input terminal of said first intermediate frequency ammplifier, the first output terminals of said first, second and third differential circuits being connected in common to a reference terminal of said fourth differential circuit, the second output terminals of said first, second and third differential circuits being connected in common to a reference terminal of said fifth differential circuit, the first input terminals of said fourth and fifth differential circuits being connected in common to the first output terminal of said differential amplifier of said first intermediate frequency amplifier, the second input terminals of said fourth and fifth differential circuits being connected in common to the second output terminal of said differential amplifier of said first intermediate frequency amplifier, and the first output terminals of said fourth and fifth differential circuits being connected in common to said rectification output terminal, a last one of said full-wave rectifiers including sixth, seventh, eighth, ninth and tenth differential circuits each having first and second input terminals and first and second output terminals, the first input terminals of said sixth and seventh differential circuits being connected in common to said first signal input terminal of a last one of said intermediate frequency amplifiers, the second input terminals of said sixth and seventh differential circuits being connected in common to said second signal input terminal of said last intermediate frequency amplifier, the first and second input terminals of said eighth differential circuit being connected respectively to said first and second signal output terminals of said last intermediate frequency amplifier, the first output terminals of said sixth, seventh and eighth differential circuits being connected in common to a reference terminal of said ninth differential circuit, the second output terminals of sixth, seventh and eighth differential circuits being connected in common to a reference terminal of said tenth differential circuit, the first input terminals of said ninth and tenth differential circuits being connected in common to the first output terminal of said differential amplifier of said last intermediate frequency amplifier, the second input terminals of said ninth and tenth differential circuits being connected in common to the second output terminal of said differential amplifier of said last intermediate frequency amplifier, and the first output terminals of said ninth and tenth differential circuits being connected in common to said rectification output termminal, each of the remaining full-wave rectifiers including eleventh, twelfth, thirteenth and fourteenth differential circuits each having first and second input terminals and first and second output terminals, the first input terminals of said eleventh and twelfth differential circuits being connected in common to said first signal input terminal of an associated one of the remaining intermediate frequency amplifiers, the second input terminals of said eleventh and twelfth differential circuits being connected in common to said second signal input terminal of said associated remaining intermediate frequency amplifier, the first output terminals of said eleventh and twelfth differential circuits being connected in common to a reference terminal of said thirteenth differential circuit, the second output terminals of said eleventh and twelfth differential circuits being connected in common to a reference terminal of said fourteenth differential circuit, the first input terminals of said thirteenth and fourteenth differential circuits being connected in common to the first output terminal of said differential amplifier of said associated remaining intermediate frequency amplifier, the second input terminals of said thirteenth and fourteenth differential circuits being connected in common to the second output terminal of said differential amplifier of said associated remaining intermediate frequency amplifier, and the first output terminals of said thirteenth and fourteenth differential circuits being connected in common to said rectification output terminal; and an adder circuit coupled to the rectification output terminals of the respective full-wave rectifiers for adding rectified outputs thereof.

* * * * *

UNITED STATES PATENT AND TRADEMARK OFFICE
CERTIFICATE OF CORRECTION

PATENT NO. : 4,680,553

DATED : July 14, 1987

INVENTOR(S) : Katsuji Kimura et al

It is certified that error appears in the above-identified patent and that said Letters Patent is hereby corrected as shown below:

Column 5, line 29, before "and" insert -- 25°C --;

Column 5, line 59, change "addes" to -- adds --;

Column 8, line 66, change "$\sqrt{g0}$" to -- $^m\sqrt{g0}$ --;

Column 9, lines 6, 9, 16 and 18, change "$\sqrt{g0}$" to -- $^m\sqrt{g0}$ --;

Column 9, line 55, change "addes" to -- adds --;

Column 10, line 43, change "termi" to -- terminals --;

Column 10, line 50, change "to common" to -- in common --.

Signed and Sealed this

Twenty-sixth Day of July, 1988

Attest:

DONALD J. QUIGG

Attesting Officer     Commissioner of Patents and Trademarks